US012761708B2

(12) United States Patent
Wu

(10) Patent No.: US 12,761,708 B2
(45) Date of Patent: Oct. 13, 2026

(54) POWER SUPPLY UNIT

(71) Applicant: Chicony Power Technology Co., Ltd., New Taipei City (TW)

(72) Inventor: Cheng-Chan Wu, New Taipei City (TW)

(73) Assignee: CHICONY POWER TECHNOLOGY CO., LTD., New Taipei City (TW)

( * ) Notice: Subject to any disclaimer, the term of this patent is extended or adjusted under 35 U.S.C. 154(b) by 134 days.

(21) Appl. No.: 18/953,286

(22) Filed: Nov. 20, 2024

(65) Prior Publication Data

US 2026/0096045 A1 Apr. 2, 2026

(30) Foreign Application Priority Data

Oct. 1, 2024 (TW) ................................ 113137645

(51) Int. Cl.

*G06F 1/188* (2026.01)
*H01R 13/70* (2006.01)
*H05K 5/02* (2006.01)
*H05K 7/14* (2006.01)

(52) U.S. Cl.

CPC ........... *G06F 1/188* (2013.01); *H05K 7/1411* (2013.01); *H05K 7/1414* (2013.01); *H05K 7/1432* (2013.01); *H01R 13/70* (2013.01); *H01R 13/701* (2013.01); *H05K 5/0221* (2013.01);

(Continued)

(58) Field of Classification Search

CPC ............... H05K 7/1414; H05K 7/1432; H05K 7/14322; H05K 7/1411; H05K 7/1418; H05K 5/0221; H05K 7/1489; H01R 13/70; H01R 13/701; G06F 1/188

See application file for complete search history.

(56) References Cited

U.S. PATENT DOCUMENTS 5,545,862 A 8/1996 Takano et al.
5,949,652 A * 9/1999 McAnally ............... G06F 1/184 439/911

(Continued)

FOREIGN PATENT DOCUMENTS

CN 106531512 A 3/2017
CN 209822516 U 12/2019

(Continued)

*Primary Examiner* — Nidhi Thaker
(74) *Attorney, Agent, or Firm* — Birch, Stewart, Kolasch & Birch, LLP

(57) ABSTRACT

A power supply unit is provided, including a frame, a circuit board, a switch component, and a latch component. The frame includes an opening, a first opening groove, and a second opening groove. The circuit board is arranged in the frame. The switch component is embedded in the opening. The latch component includes an operating member and a latch member. The operating member protrudes from the first opening groove, and is connected to the latch member. The latch member is connected to the frame and includes a snap portion which protrudes from the second opening groove. When a button portion of the switch component is away from the frame, and a coupling portion of the switch component is disconnected, the pressing portion moves toward the opening along the first opening groove under an acting force, and drives the snap portion to move toward the inside of the frame.

21 Claims, 4 Drawing Sheets

(52) U.S. Cl.
CPC ....... *H05K 7/1418* (2013.01); *H05K 7/14322* (2022.08); *H05K 7/1489* (2013.01)

(56) References Cited

U.S. PATENT DOCUMENTS

| | | | | |
|---|---|---|---|---|
| 6,577,501 | B2 * | 6/2003 | Lin | G06F 1/184 361/759 |
| 7,791,865 | B2 * | 9/2010 | Wirtzberger | H05K 7/1457 361/728 |
| 8,611,103 | B2 * | 12/2013 | Thomas | H05K 7/1489 361/801 |
| 9,723,756 | B1 * | 8/2017 | Masters | H05K 7/1489 |
| 10,622,761 | B1 * | 4/2020 | Held | H01R 13/6315 |
| 12,532,429 | B2 * | 1/2026 | Li | G06F 1/181 |
| 2011/0249382 | A1 * | 10/2011 | Tsubota | H05K 7/20145 361/679.01 |
| 2019/0289742 | A1 * | 9/2019 | Shen | H05K 7/14325 |
| 2022/0018528 | A1 | 1/2022 | Chen et al. | |
| 2024/0319698 | A1 * | 9/2024 | Andersen | G05B 19/048 |

FOREIGN PATENT DOCUMENTS

| | | | | | |
|---|---|---|---|---|---|
| CN | 111180239 | A | | 5/2020 | |
| CN | 111694406 | A | * | 9/2020 | G06F 1/183 |
| CN | 215266016 | U | | 12/2021 | |
| CN | 220420473 | U | | 1/2024 | |
| TW | M429129 | U1 | | 5/2012 | |
| TW | I621936 | B | | 4/2018 | |
| TW | I705750 | B | | 9/2020 | |

* cited by examiner

POWER SUPPLY UNIT

CROSS-REFERENCE TO RELATED APPLICATION

This non-provisional application claims priority under 35 U.S.C. § 119(a) to patent application No. 113137645 filed in Taiwan, R.O.C. on Oct. 1, 2024, the entire contents of which are hereby incorporated by reference.

BACKGROUND

Technical Field

The present invention relates to a power supply unit, and in particular, to a power supply unit with a fool-proof structure.

Related Art

A fool-proof structure is arranged in a common power supply unit, to prevent a user from electric shock when the power supply unit is detached from a device. For example, when the power supply unit is in an on state and a wire is inserted into a socket portion, if the user applies a force to push a clamping structure between the power supply unit and the device, the clamping structure abuts against the wire in the socket portion and causes interference, to prevent the user from detaching the power supply unit when the power supply unit is in the on state.

However, with this structure, when the user wants to detach the power supply unit from the device, the user needs to first unplug the wire inserted into the socket portion to perform a detachment operation, which results in a burden on an operation of the user.

SUMMARY

In view of this, a power supply unit is provided according to an embodiment, including a frame, a circuit board, a switch component, and a latch component. The frame includes an opening, a first opening groove, and a second opening groove. The circuit board is arranged in the frame. The switch component includes a button portion, a body, and a coupling portion. The body is embedded in the opening, the button portion is movably arranged on the body and located outside the frame, the coupling portion is arranged on the body and electrically connected to the circuit board, and the coupling portion may be selectively connected or disconnected. The latch component includes an operating member and a latch member. The operating member includes a pressing portion and an extension portion. The pressing portion is connected to the extension portion, the pressing portion protrudes from the first opening groove, and the extension portion is connected to the latch member. The latch member includes a snap portion, and the snap portion protrudes from the frame from the second opening groove. When the button portion is away from the frame and the coupling portion is disconnected, the pressing portion moves toward the opening along the first opening groove under an acting force, and drives the snap portion to move toward an inside of the frame.

In some embodiments, when the button portion is close to the frame, the coupling portion is connected, and the pressing portion is stopped by the button portion.

In some embodiments, the button portion includes a button and a column body. The button is connected to the body through the column body. When the button portion is close to the frame, an outer surface of the button and a surface of the pressing portion are substantially located on a same plane.

In some embodiments, the button portion includes a button and a column body, the button is connected to the body through the column body, and when the button portion is close to the frame, projection areas of the pressing portion and the button in a direction overlap with each other.

In some embodiments, the coupling portion includes a contact terminal and a conductive terminal, the conductive terminal is connected to the circuit board, when the button portion is away from the frame, the contact terminal and the conductive terminal are away from each other to be disconnected, and when the button portion is close to the frame, the contact terminal and the conductive terminal are in contact with each other to be connected.

In some embodiments, the frame includes a first surface and a second surface, the first surface and the second surface are perpendicularly adjacent surfaces, the opening and the first opening groove are located on the first surface, and the second opening groove is located on the second surface.

In some embodiments, the pressing portion moves relative to the frame in the first opening groove in a direction substantially parallel to the first surface, and the snap portion moves relative to the frame in the second opening groove in a direction substantially perpendicular to the second surface.

In some embodiments, the latch member includes a fixed end and a movable end opposite to each other, the fixed end is located in a direction away from the switch component and is fixed to the frame, the snap portion is arranged on the movable end, and the movable end is connected to the extension portion.

In some embodiments, the movable end includes a clamping portion, and the extension portion is clamped to the clamping portion.

In some embodiments, the clamping portion includes a first snap fastener and a second snap fastener, each of the first snap fastener and the second snap fastener extends in an orthogonal direction, the extension portion includes a clamping slot and a bump, the first snap fastener is accommodated in the clamping slot, and the bump protrudes toward the second opening groove and abuts against the second snap fastener.

In addition, a power supply unit is provided according to an embodiment, including a frame, a switch component, and a latch component. The frame includes an opening, a first opening groove, and a second opening groove. The circuit board is arranged in the frame. The switch component includes a button portion and a body. The body is embedded in the opening, and the button portion is movably arranged on the body and located outside the frame. The latch component includes an operating member and a latch member. The operating member includes a pressing portion and an extension portion. The pressing portion is connected to the extension portion, the pressing portion protrudes from the first opening groove, and the extension portion is connected to the latch member. The latch member includes a snap portion, and the snap portion protrudes from the frame from the second opening groove. When the button portion is away from the frame, the pressing portion moves toward the opening along the first opening groove under an acting force, and drives the snap portion to move toward an inside of the frame.

In summary, a power supply is provided according to an embodiment. By pressing the switch component, a gap is generated between the button portion of the switch component and the frame. In this case, a user may press the pressing portion of the operating member of the latch component to release assembly with a device and disassemble the power supply unit from the device in which the power supply unit is used. In addition, when the button portion is pressed, the button portion is away from the frame, and the electrical connection between the switch component and the circuit board can be disconnected, to avoid electric shock of the user. In this way, the power supply unit can be detached without detaching other elements, which simplifies a detachment step for the user, and protects safety of the user.

DETAILED DESCRIPTION

Figure 1:
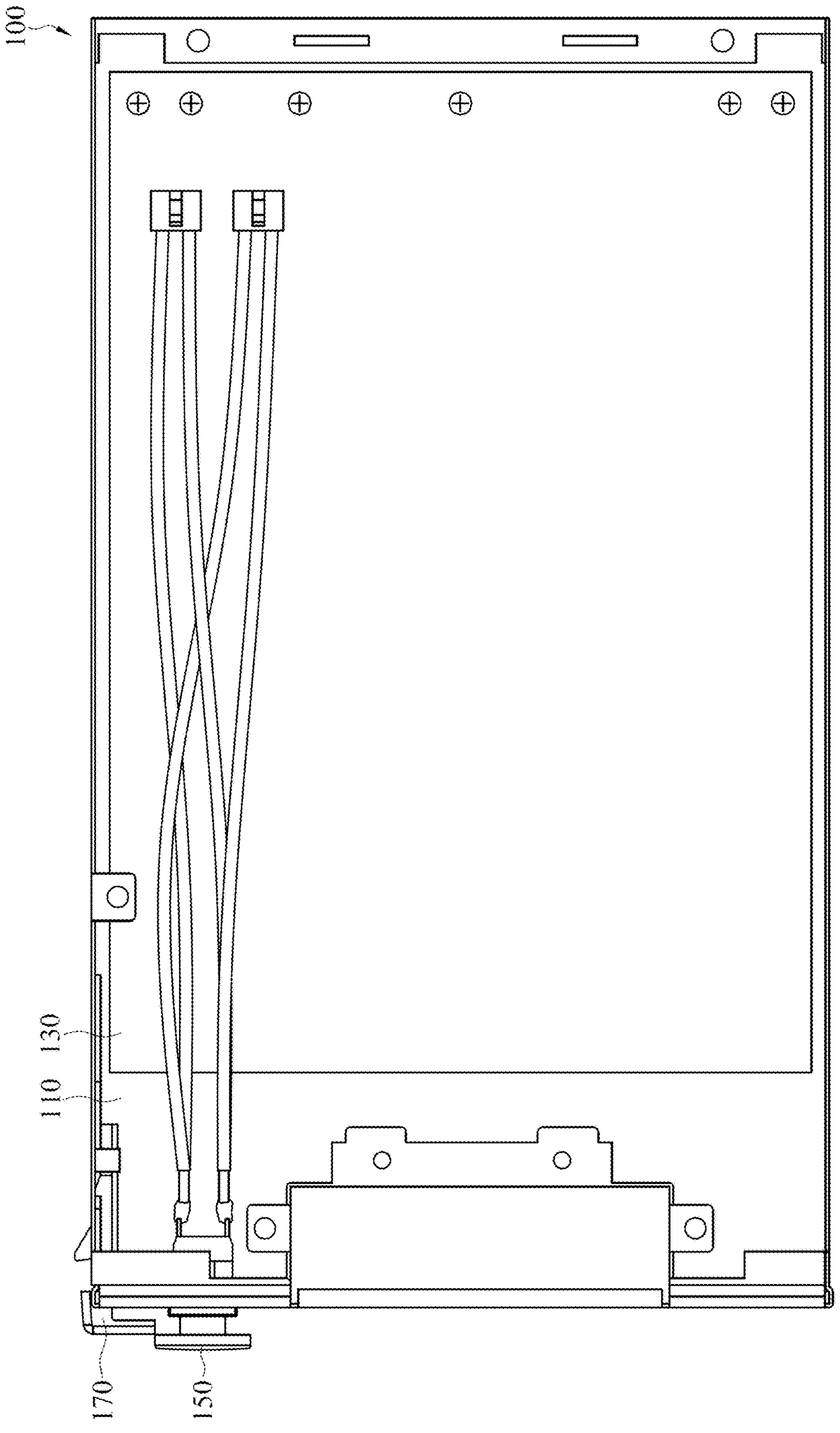
FIG. 1 is a front view of a power supply unit according to an embodiment.
Figure 2:
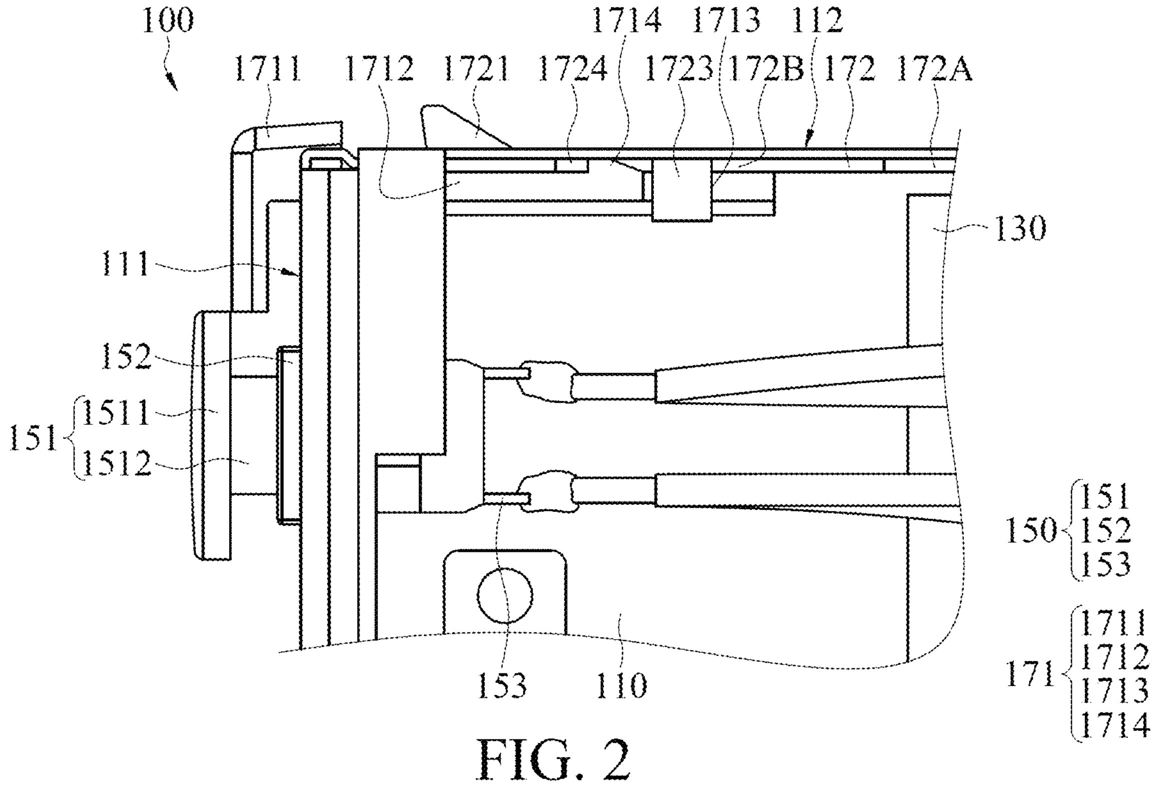
FIG. 2 is a schematic diagram of a button portion of a power supply unit away from a frame according to an embodiment.
Figure 3:
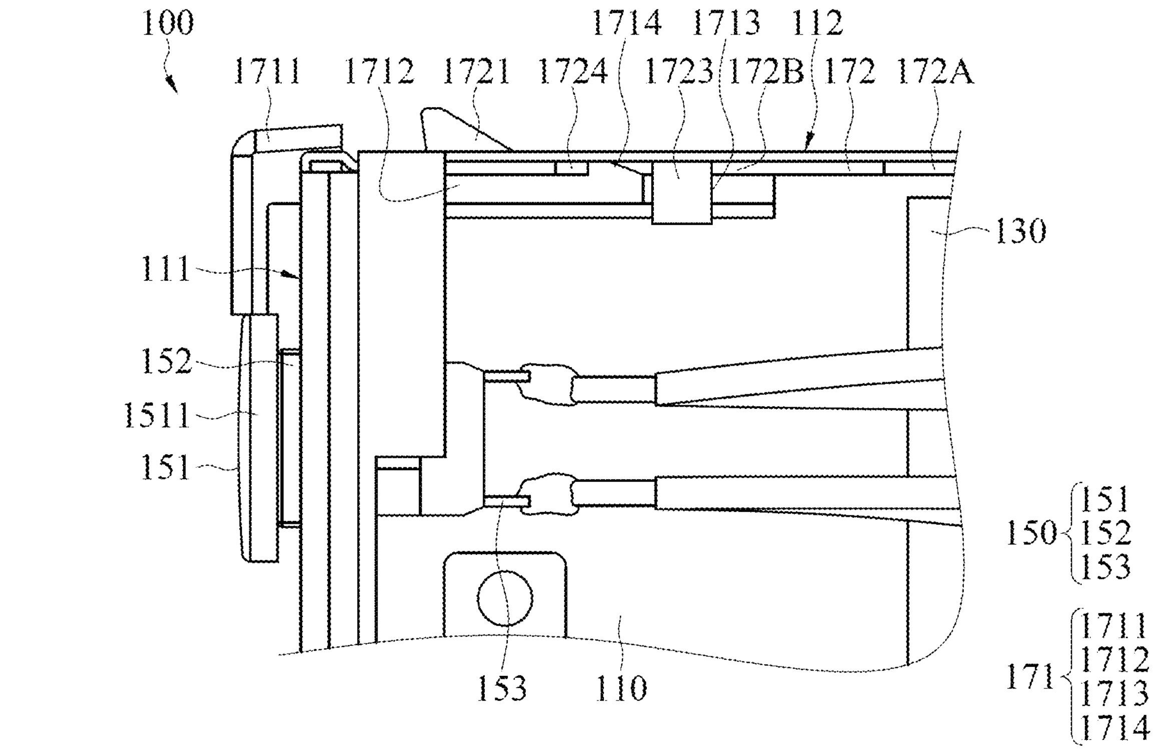
FIG. 3 is a schematic diagram of a button portion of a power supply unit close to a frame according to an embodiment.
Figure 4:
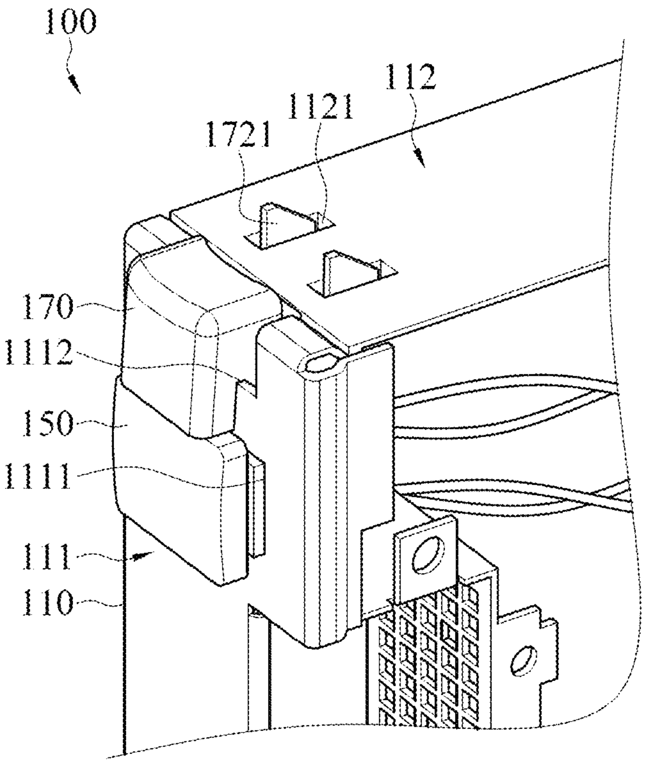
FIG. 4 is a schematic diagram of a button portion of a power supply unit close to a frame from another angle according to an embodiment.

Refer to FIG. 1 to FIG. 4. FIG. 1 is a front view of a power supply unit according to an embodiment. FIG. 2 is a schematic diagram of a button portion of a power supply unit away from a frame according to an embodiment. FIG. 3 is a schematic diagram of a button portion of a power supply unit close to a frame according to an embodiment. FIG. 4 is a schematic three-dimensional diagram of a button portion of a power supply unit close to a frame from another angle according to an embodiment. The power supply unit 100 shown in FIG. 1 is a power supply unit 100 that can be entirely assembled to or detached from a to-be-used device. The power supply unit 100 includes a frame 110, a switch component 150, and a latch component 170.

As shown in FIG. 4, the frame 110 includes an opening 1111, a first opening groove 1112, and a second opening groove 1121. In this embodiment, the frame 110 includes a first surface 111 and a second surface 112, the first surface 111 and the second surface 112 are perpendicularly adjacent surfaces. The opening 1111 and the first opening groove 1112 are located on the first surface 111, and the second opening groove 1121 is located on the second surface 112.

It can be seen from FIG. 2 and FIG. 4 that the switch component 150 includes a button portion 151 and a body 152. The body 152 is embedded in the opening 1111, and the button portion 151 is movably arranged on the body 152 and located outside the frame 110. In this embodiment, a user may apply a force to the button portion 151 to cause the button portion 151 to be close to the frame 110 (as shown in FIG. 3) or away from the frame 110 (as shown in FIG. 2).

Figure 7:
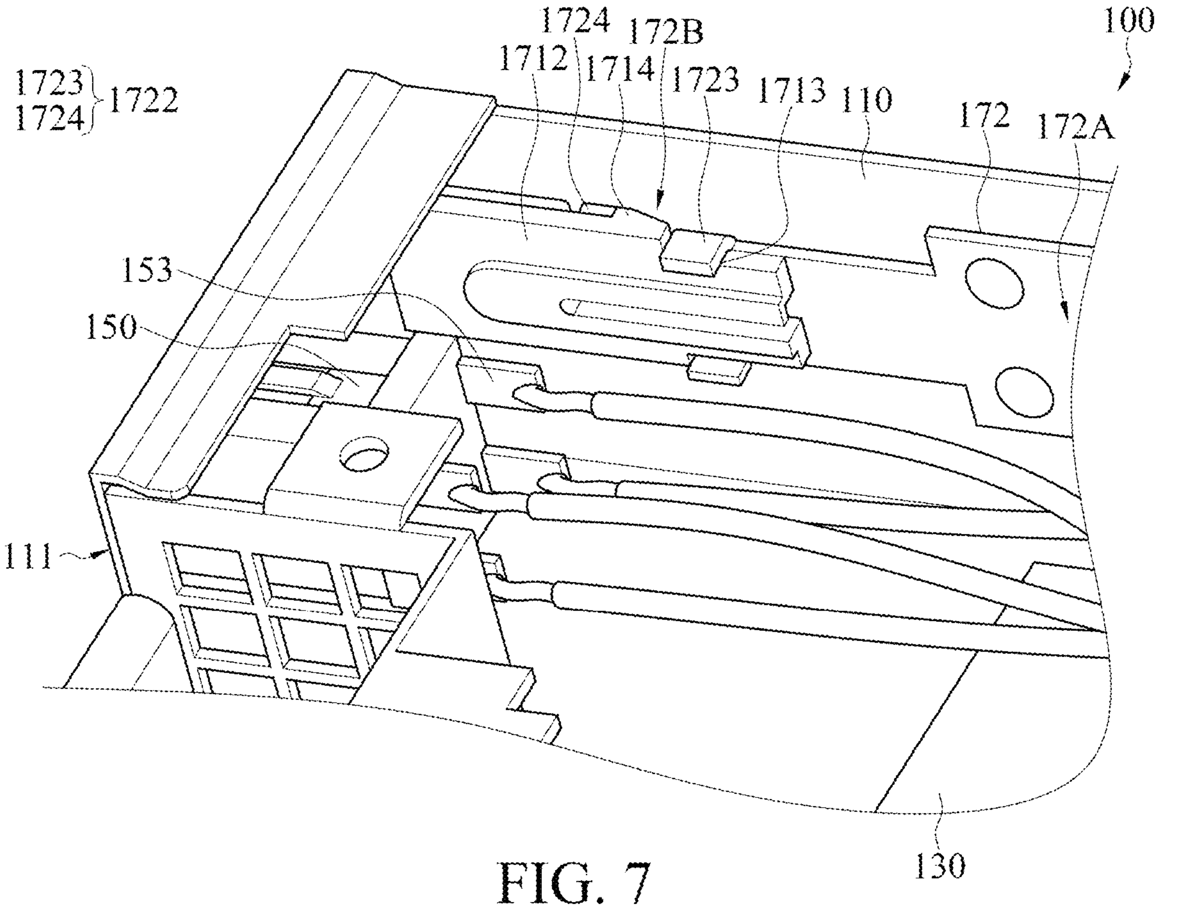
FIG. 7 is a schematic diagram of viewing an inside of a frame in a power supply unit from a lower side to an upper side in FIG. 1 according to an embodiment.

It can be seen from FIG. 2 to FIG. 4, the latch component 170 includes an operating member 171 and a latch member 172. The operating member 171 includes a pressing portion 1711 and an extension portion 1712. The pressing portion 1711 is connected to the extension portion 1712, and the pressing portion 1711 protrudes from the first opening groove 1112. In this embodiment, one end of the pressing portion 1711 extends in a direction of the opening 1111 (that is, extends toward a lower part of the figure), and the other end of the pressing portion is connected to the extension portion 1712. In addition, refer to FIG. 2 to FIG. 4, and refer to FIG. 7 together. FIG. 7 is a schematic diagram of viewing an inside of a frame in a power supply unit from a lower side to an upper side in FIG. 1 according to an embodiment. The extension portion 1712 is connected to the latch member 172. One end of the latch member 172 is connected to the frame 110 and includes a snap portion 1721 at the other end. The snap portion 1721 protrudes from the frame 110 from the second opening groove 1121. A specific structure of the latch member 172 is described in detail below. In addition, refer to FIG. 2 to FIG. 4 again. For an assembly structure of assembling the power supply unit 100 to a to-be-used device, in this embodiment, the snap portion 1721 is used as a male end, to be snapped to a female end of the to-be-used device, to achieve an assembly effect. In this embodiment, the user may apply a force to the pressing portion 1711, so that the pressing portion 1711 moves relative to the frame 110 in the first opening groove 1112 in a direction substantially parallel to the first surface 111, and drives the snap portion 1721 to move relative to the frame 110 in the second opening groove 1121 in a direction substantially perpendicular to the second surface 112. In this way, the snap portion 1721 moves from the second opening groove 1121 to the inside of the frame 110, to release a snap fastener with a female terminal of a to-be-used device.

When the button portion 151 is away from the frame 110, the pressing portion 1711 moves toward the opening 1111 along the first opening groove 1112 under an acting force, and drives the snap portion 1721 to move toward the inside of the frame 110. For example, when the button portion 151 is away from the frame 110, a gap is generated between the button portion 151 and the frame 110, and is used as a space for the pressing portion 1711 to move. When it is intended to release the snap fastener of the snap portion 1721 from a device in which the snap portion is used, a user applies a force to the pressing portion 1711 to move the pressing portion toward the opening 1111, so that the extension portion 1712 drives an end of the latch member 172 connected to the extension portion 1712 to move toward the inside of the frame 110 relative to the end of the latch member 172 connected to the frame 110, so that the snap portion 1721 enters the inside of the frame 110 through the second opening groove 1121 from the outside of the frame 110. In this way, the user can detach the power supply unit 100 from the device in which the power supply unit is used by releasing the snap fastener of the snap portion 1721.

More specifically, by pressing the switch component 150, a gap is generated between the button portion 151 of the switch component 150 and the frame 110, which is the state shown in FIG. 2. Next, the user may press the pressing portion 1711 of the latch component 170, to enable the snap portion 1721 to enter the frame 110 from the second opening groove 1121, to release the snap fastener with the device and detach the power supply unit 100 from the device in which the power supply unit is used. In this way, the power supply unit can be detached without detaching other elements, which simplifies a detachment step for the user.

In addition, it can be seen from FIG. 2, in this embodiment, the power supply unit 100 further includes a circuit board 130. The circuit board 130 is arranged in the frame 110. The switch component 150 further includes a coupling portion 153. The coupling portion 153 is arranged on the body 152 and is electrically connected to the circuit board 130, and the coupling portion 153 may be selectively connected or disconnected. In a state shown in FIG. 2, when the button portion 151 is away from the frame 110, the coupling portion 153 is disconnected. For example, when the user presses the button portion 151 away from the frame 110, the coupling portion 153 is disconnected from the circuit board 130. In this way, the user can be prevented from electric shock when the power supply unit 100 is detached, thereby protecting safety of the user when the power supply unit 100 is detached. A structure of the electrical connection between the coupling portion 153 and the circuit board 130 is described in detail below.

Refer to FIG. 3. In this embodiment, when the user presses the button portion 151 and brings the button portion 151 close to the frame 110, the coupling portion 153 is connected to the circuit board 130. In this case, a movement path of the pressing portion 1711 is blocked by the button portion 151, so that the user cannot press the pressing portion 1711 to move the pressing portion 1711. In this way, because the user cannot press the pressing portion 1711 to release the snap fastener of the snap portion 1721 in the on state, the user can be prevented from electric shock when the power supply unit 100 is detached and the circuit is connected.

Further, refer to FIG. 2 and FIG. 3 together. In this embodiment, the button portion 151 includes a button 1511 and a column body 1512. The button 1511 is connected to the body 152 through the column body 1512. Because there is a section difference between the button 1511 and the column body 1512, when the button portion 151 is away from the frame 110, the section difference between the button 1511 and the column body 1512 forms a space for the pressing portion 1711 to move. When the button portion 151 is close to the frame 110, an outer surface of the button 1511 and a surface of the pressing portion 1711 are substantially located on a same plane, and projection areas of the pressing portion 1711 and the button portion 151 in a direction overlap with each other. Herein, the direction refers to a direction from top to bottom in FIG. 3, and projection areas of the pressing portion 1711 and the button portion 151 from top to bottom overlap with each other. In this way, even if the user presses the pressing portion 1711 by applying a force, the pressing portion 1711 cannot move due to blocking by the button 1511.

Figure 5:
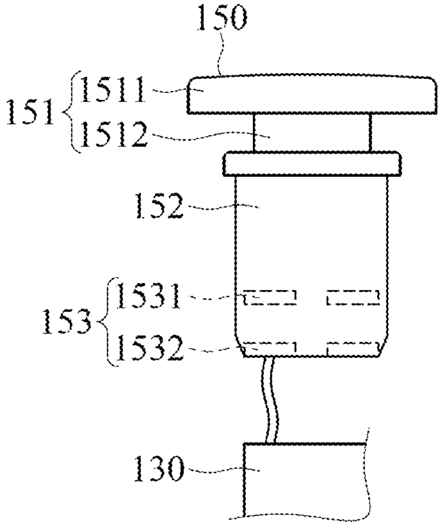
FIG. 5 is a schematic diagram of a switch component in an off state according to an embodiment.
Figure 6:
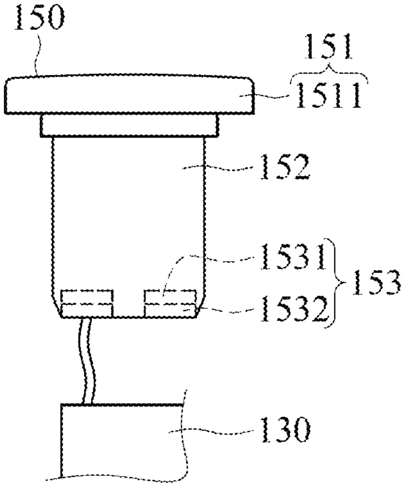
FIG. 6 is a schematic diagram of a switch component in a conducted state according to an embodiment.

For the structure of the electrical connection between the coupling portion 153 and the circuit board 130, refer to FIG. 5 and FIG. 6. FIG. 5 is a schematic diagram of a switch component in an off state according to an embodiment. FIG. 6 is a schematic diagram of a switch component in an on state according to an embodiment. The coupling portion 153 is arranged in the body 152 and includes a contact terminal 1531 and a conductive terminal 1532, and the conductive terminal 1532 is electrically connected to the circuit board 130. The user may selectively enable the contact terminal 1531 to come into contact with or move away from the conductive terminal 1532 by applying a force to the button portion 151. For example, when the user presses the button portion 151 by applying a force and moves the button portion 151 away from the frame 110, the contact terminal 1531 and the conductive terminal 1532 are also away from each other to be disconnected. When the user applies a force to the button portion 151 and brings the button portion 151 close to the frame 110, the contact terminal 1531 and the conductive terminal 1532 are also in contact with each other to be connected. In this way, in addition to moving the pressing portion 1711 or blocking the movement of the pressing portion 1711 based on a position of the button portion 151, the coupling portion 153 may also be connected or disconnected from the circuit board 130 through the button portion 151.

For a detailed structure of the latch member 172, refer to FIG. 1, FIG. 4, and FIG. 7. In this embodiment, the latch member 172 includes a fixed end 172A and a movable end 172B opposite to each other, the fixed end 172A is located in a direction away from the switch component 150 and is fixed to the frame 110, the snap portion 1721 is arranged on the movable end 172B, and the movable end 172B is connected to the extension portion 1712. In this way, when the user applies a force to the pressing portion 1711 to move the pressing portion toward the opening 1111, the extension portion 1712 drives the movable end 172B of the latch member 172 to move toward the inside of the frame 110 by using a fulcrum at which the latch member 172 is fixed to a fixed end 172A of the frame 110, so that the snap portion 1721 of the movable end 172B enters the inside of the frame 110 from the outside of the frame 110 through the second opening groove 1121.

Further, in this embodiment, the movable end 172B includes a clamping portion 1722, and the extension portion 1712 is clamped to the clamping portion 1722. The clamping portion 1722 includes a first snap fastener 1723 and a second snap fastener 1724, and each of the first snap fastener 1723 and the second snap fastener 1724 extends in an orthogonal direction, to respectively limit movement of the extension portion 1712. The extension portion 1712 includes a clamping slot 1713 and a bump 1714. The first snap fastener 1723 is accommodated in the clamping slot 1713 to prevent the extension portion 1712 from being offset relative to the latch member 172 on a surface parallel to the second surface 112. The bump 1714 protrudes toward the second opening groove 1121 and abuts against the second snap fastener 1724, to prevent the extension portion 1712 from moving relative to the latch member 172 in a direction parallel to the second surface 112. To be specific, when the operating member 171 and the latch member 172 are grouped together, the extension portion 1712 moves toward the movable end 172B. In this case, ends of the extension portion 1712 pass through a gap between the two first snap fasteners 1723, and the ends can pass close to each other through the gap between the two first snap fasteners 1723 through an opening groove in the middle, until the two first snap fasteners 1723 are accommodated in corresponding clamping slots 1713. In addition, during the movement, the bump 1714 is always pushed by a bottom surface of the latch member 172 and is elastically deformed in a direction away from the bottom surface of the latch member 172. When the bump 1714 moves to the second snap fastener 1724, the bump 1714 returns upward to an original shape without being abutted against the second snap fastener 1724 until the bump 1714 protrudes against the second snap fastener 1724. In this case, when the extension portion 1712 is pressed to move toward the inside of the frame 110 parallel to the second surface 112, the extension portion 1712 cannot move relative to the latch member 172 alone because the first snap fastener 1723 is accommodated in the clamping slot 1713. If the extension portion 1712 is pulled to move outward of the frame 110 parallel to the second surface 112, the bump 1714 protrudes toward the second opening groove 1121 and abuts against the second snap fastener 1724, so that the extension portion 1712 cannot move relative to the latch member 172 alone.

In summary, a power supply unit 100 is provided according to an embodiment. The user presses the switch component 150 to generate a gap between the button portion 151 of the switch component 150 and the frame 110. Next, the user may press the pressing portion 1711 of the latch component 170, to enable the snap portion 1721 to enter the frame 110 from the second opening groove 1121, to release the snap fastener with the device in which the snap portion 1721 is used, and detach the power supply unit 100 from the device in which the power supply unit 100 is used. In this way, the power supply unit 100 can be detached without detaching other elements, which simplifies a detachment step for the user. Further, when the user presses the button portion 151 away from the frame 110, the coupling portion 153 is disconnected from the circuit board 130. In this way, the user can be prevented from electric shock when the power supply unit 100 is detached, thereby protecting safety of the user when the power supply unit 100 is detached.

What is claimed is:

1. A power supply unit, comprising:

a frame, comprising an opening, a first opening groove, and a second opening groove;

a circuit board, arranged in the frame;

a switch component, comprising a button portion, a body, and a coupling portion, wherein the body is embedded in the opening, the button portion is movably arranged on the body and located outside the frame, the coupling portion is arranged on the body and electrically connected to the circuit board, and the coupling portion is selectively connected or disconnected; and a latch component, comprising an operating member and a latch member, wherein the operating member comprises a pressing portion and an extension portion, the pressing portion is connected to the extension portion, the pressing portion protrudes from the first opening groove, the extension portion is connected to the latch member, the latch member is connected to the frame and comprises a snap portion, and the snap portion protrudes from the frame from the second opening groove, wherein when the button portion is away from the frame, and the coupling portion is disconnected, the pressing portion moves toward the opening along the first opening groove under an acting force, and drives the snap portion to move toward an inside of the frame.

2. The power supply unit according to claim 1, wherein when the button portion is close to the frame, the coupling portion is connected, and the pressing portion is stopped by the button portion.

3. The power supply unit according to claim 2, wherein the button portion comprises a button and a column body, the button is connected to the body through the column body, and when the button portion is close to the frame, an outer surface of the button and a surface of the pressing portion are substantially located on a same plane.

4. The power supply unit according to claim 2, wherein the button portion comprises a button and a column body, the button is connected to the body through the column body, and when the button portion is close to the frame, projection areas of the pressing portion and the button in a direction overlap with each other.

5. The power supply unit according to claim 1, wherein the coupling portion comprises a contact terminal and a conductive terminal, the conductive terminal is connected to the circuit board, when the button portion is away from the frame, the contact terminal and the conductive terminal are away from each other to be disconnected, and when the button portion is close to the frame, the contact terminal and the conductive terminal are in contact with each other to be connected.

6. The power supply unit according to claim 1, wherein the frame comprises a first surface and a second surface, the first surface and the second surface are perpendicularly adjacent surfaces, the opening and the first opening groove are located on the first surface, and the second opening groove is located on the second surface.

7. The power supply unit according to claim 6, wherein the pressing portion moves relative to the frame in the first opening groove in a direction substantially parallel to the first surface, and the snap portion moves relative to the frame in the second opening groove in a direction substantially perpendicular to the second surface.

8. The power supply unit according to claim 1, wherein the latch member comprises a fixed end and a movable end opposite to each other, the fixed end is located in a direction away from the switch component and is fixed to the frame, the snap portion is arranged on the movable end, and the movable end is connected to the extension portion.

9. The power supply unit according to claim 8, wherein the movable end comprises a clamping portion, and the extension portion is clamped to the clamping portion.

10. The power supply unit according to claim 9, wherein the clamping portion comprises a first snap fastener and a second snap fastener, each of the first snap fastener and the second snap fastener extends in an orthogonal direction, the extension portion comprises a clamping slot and a bump, the first snap fastener is accommodated in the clamping slot, and the bump protrudes toward the second opening groove and abuts against the second snap fastener.

11. A power supply unit, comprising:

a frame, comprising an opening, a first opening groove, and a second opening groove;

a switch component, comprising a button portion and a body, wherein the body is embedded in the opening, and the button portion is movably arranged on the body and located outside the frame; and a latch component, comprising an operating member and a latch member, wherein the operating member comprises a pressing portion and an extension portion, the pressing portion is connected to the extension portion, the pressing portion protrudes from the first opening groove, the extension portion is connected to the latch member, the latch member is connected to the frame and comprises a snap portion, and the snap portion protrudes from the frame from the second opening groove, wherein when the button portion is away from the frame, the pressing portion moves relative to the frame toward the opening along the first opening groove under an acting force, and drives the snap portion to move toward an inside of the frame.

12. The power supply unit according to claim 11, further comprising a circuit board, arranged in the frame, wherein the switch component further comprises a coupling portion, the coupling portion is arranged on the body and electrically connected to the circuit board, the coupling portion is selectively connected or disconnected, and when the button portion is away from the frame, the coupling portion is disconnected.

13. The power supply unit according to claim 12, wherein when the button portion is close to the frame, the coupling portion is connected, and the pressing portion is stopped by the button portion.

14. The power supply unit according to claim 13, wherein the button portion comprises a button and a column body, the button is connected to the body through the column body, and when the button portion is close to the frame, an outer surface of the button and a surface of the pressing portion are substantially located on a same plane.

15. The power supply unit according to claim 13, wherein the button portion comprises a button and a column body, the button is connected to the body through the column body, and when the button portion is close to the frame, projection areas of the pressing portion and the button in a direction overlap with each other.

16. The power supply unit according to claim 12, wherein the coupling portion comprises a contact terminal and a conductive terminal, the conductive terminal is connected to the circuit board, when the button portion is away from the frame, the contact terminal and the conductive terminal are away from each other to be disconnected, and when the button portion is close to the frame, the contact terminal and the conductive terminal are in contact with each other to be connected.

17. The power supply unit according to claim 11, wherein the frame comprises a first surface and a second surface, the first surface and the second surface are perpendicularly adjacent surfaces, the opening and the first opening groove are located on the first surface, and the second opening groove is located on the second surface.

18. The power supply unit according to claim 17, wherein the pressing portion moves relative to the frame in the first opening groove in a direction substantially parallel to the first surface, and the snap portion moves relative to the frame in the second opening groove in a direction substantially perpendicular to the second surface.

19. The power supply unit according to claim 11, wherein the latch member comprises a fixed end and a movable end opposite to each other, the fixed end is located in a direction away from the switch component and is fixed to the frame, the snap portion is arranged on the movable end, and the movable end is connected to the extension portion.

20. The power supply unit according to claim 19, wherein the movable end comprises a clamping portion, and the extension portion is clamped to the clamping portion.

21. The power supply unit according to claim 20, wherein the clamping portion comprises a first snap fastener and a second snap fastener, each of the first snap fastener and the second snap fastener extends in an orthogonal direction, the extension portion comprises a clamping slot and a bump, the first snap fastener is accommodated in the clamping slot, and the bump protrudes toward the second opening groove and abuts against the second snap fastener.

* * * * *